(12) United States Patent
Matsuda et al.

(10) Patent No.: US 7,180,388 B2
(45) Date of Patent: Feb. 20, 2007

(54) SURFACE ACOUSTIC WAVE DEVICE

(75) Inventors: Satoru Matsuda, Kawasaki (JP); Osamu Kawachi, Kanagawa (JP)

(73) Assignee: Fujitsu Media Devices Limited, Yokohama (JP)

( * ) Notice: Subject to any disclaimer, the term of this patent is extended or adjusted under 35 U.S.C. 154(b) by 88 days.

(21) Appl. No.: 11/029,500

(22) Filed: Jan. 6, 2005

(65) Prior Publication Data
US 2005/0156687 A1 Jul. 21, 2005

(30) Foreign Application Priority Data
Jan. 20, 2004 (JP) ............................. 2004-011446

(51) Int. Cl.
*H03H 9/68* (2006.01)
(52) U.S. Cl. ........................ 333/153; 333/151; 333/194
(58) Field of Classification Search ............... 333/153, 333/152, 151, 194, 195
See application file for complete search history.

(56) References Cited

U.S. PATENT DOCUMENTS
4,353,043 A * 10/1982 Gunton ...................... 333/151

FOREIGN PATENT DOCUMENTS
JP      05-102783      4/1993
JP      2000-013179    1/2000
JP      2003-051731    2/2003

* cited by examiner

*Primary Examiner*—Stephen E. Jones
(74) *Attorney, Agent, or Firm*—Arent Fox LLP

(57) ABSTRACT

The present invention provides a surface acoustic wave device that allows a plurality of surface acoustic wave filters to be formed on a single chip and permits greater miniaturization. The surface acoustic wave device comprises a piezoelectric substrate, a first surface acoustic wave resonator formed on the piezoelectric substrate, and a second surface acoustic wave resonator formed on the piezoelectric substrate in the surface acoustic wave propagation direction of the first surface acoustic wave resonator. The positions in which the first and second surface acoustic wave resonators are formed on the piezoelectric substrate are in an at least partially overlapping relationship in a surface acoustic wave propagation region that is defined by virtually extending the respective openings of the first and second surface acoustic wave resonators. The surface acoustic wave device further comprises a part for dividing the overlap surface acoustic wave propagation region into an upper half and a lower half and for affording the phases of surface acoustic waves that are propagated by the first surface acoustic wave resonator a mutually antiphase relationship in the upper-half region and lower-half region thus divided.

4 Claims, 11 Drawing Sheets

-- PRIOR ART --

-- PRIOR ART --

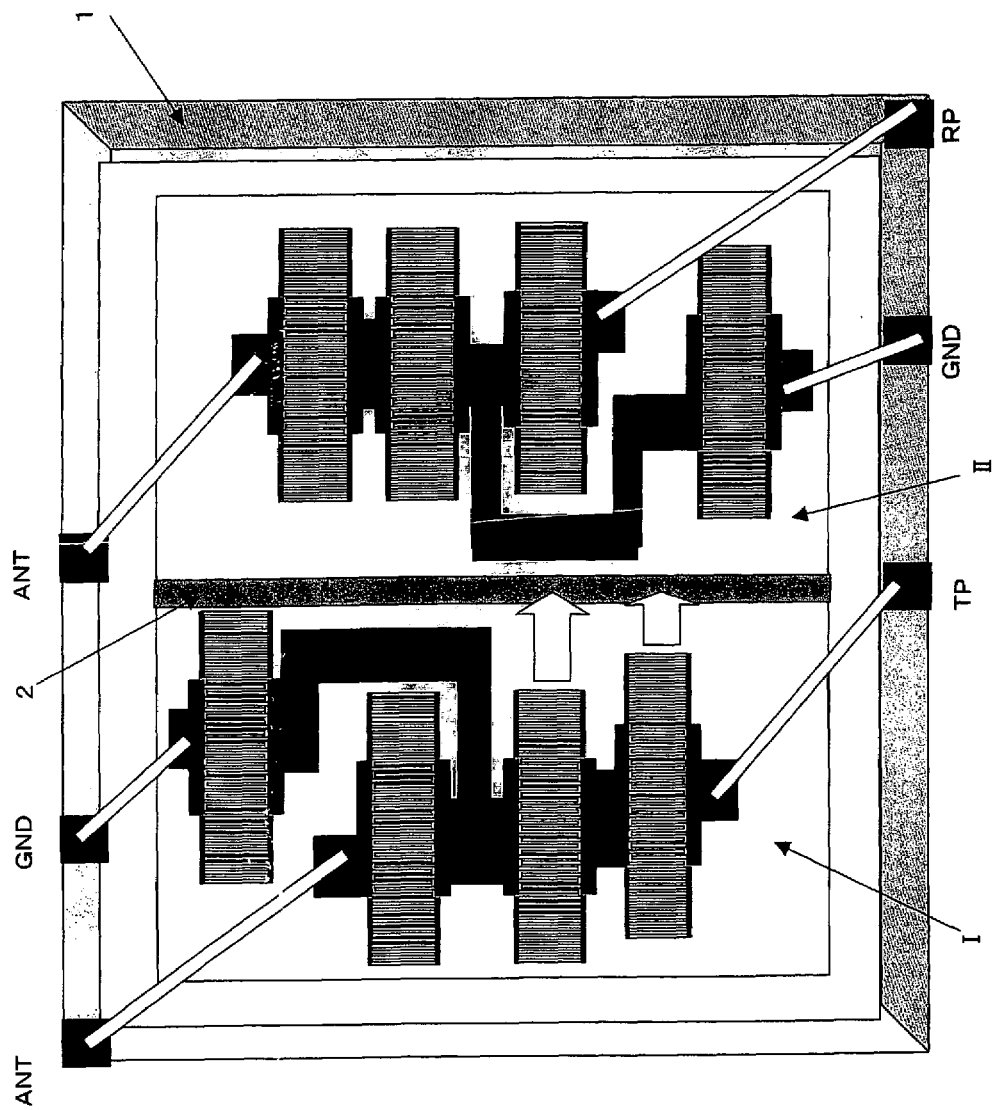
FIG. 3 -- PRIOR ART --

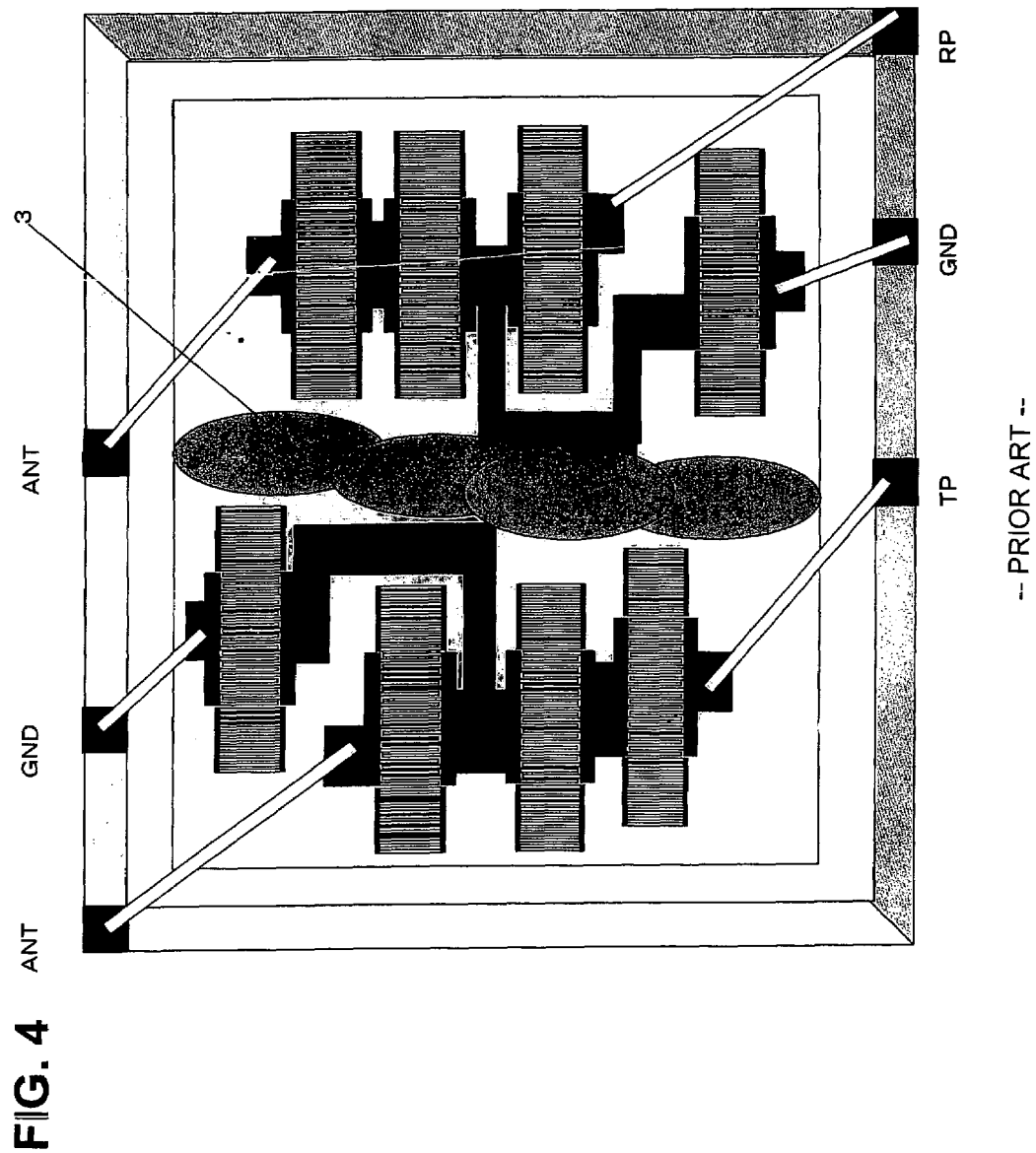
FIG. 4 — PRIOR ART —

SURFACE ACOUSTIC WAVE DEVICE

BACKGROUND OF THE INVENTION

1. Field of the Invention

The present invention relates to a surface acoustic wave device and, more particularly, a surface acoustic wave device such as a surface acoustic wave filter.

2. Description of the Related Art

Surface acoustic wave devices are used in antenna duplexers of mobile communications devices such as cellular phones. Miniaturization of mobile communication apparatuses and additional miniaturization of surface acoustic wave devices in keeping with the trend toward greater complexity are required.

In cases where a surface acoustic wave device is used in an antenna duplexer, a transmission surface acoustic wave (SAW) filter and a reception surface acoustic wave (SAW) filter are formed on the same common chip for the sake of miniaturization.

Here, cases arise where a signal that is inputted by a transmission terminal is converted into a surface acoustic wave by a transmission resonator and a short circuit is formed so that the surface acoustic wave is propagated and linked to the reception resonator. In such a case, the transmission/reception isolation characteristic deteriorates and the filter transmission characteristic is subject to spurious emission.

As conventional techniques for solving this problem, a technique that provides a groove by means of dicing between two SAW filters on a piezoelectric substrate (Japanese Patent Application Laid Open Nos. H5-102783 and 2000-13179), or a technique that allows one filter to carry parts that intersect lines that are connected to a signal terminal and lines that are connected to a ground terminal (Japanese Patent Application Laid Open No. 2003-51731), have been disclosed.

However, in the inventions appearing in Japanese Patent Application Laid Open Nos. H5-102783 and 2000-13179, the fine processing of the processing technology is problematic, there are resonator problems and limitations on placement, and there is the risk of an increase in chip size. In addition, deterioration in the characteristics is induced because chips fly toward the resonator when a groove is provided by means of dicing.

On the other hand, an object of the invention according to Japanese Patent Application Laid Open No. 2003-51731 is to prevent worsening of the isolation and the attenuation amount caused by reciprocal induction that is produced in order to counteract the magnetic flux that arises due to the influence of the current flowing to the filter.

SUMMARY OF THE INVENTION

Therefore, unlike the object and constitution described in Japanese Patent Application Laid Open No. 2003-51731, an object of the present invention is to prevent the occurrence of a short circuit. It is a further object of the present invention to provide a surface acoustic wave device that solves the problems of fine-processing complexity, an increase in chip size, and the production of chipping when a groove is provided by means of dicing, which were problems faced by both the inventions of Japanese Patent Application Laid Open Nos. H5-102783 and 2000-13179, and that allows a plurality of surface acoustic wave filters to be formed on a single chip and greater miniaturization to be achieved.

A first aspect of the surface acoustic wave device according to the present invention, which achieves the above object, comprises a piezoelectric substrate; a first surface acoustic wave resonator formed on the piezoelectric substrate; and a second surface acoustic wave resonator formed on the piezoelectric substrate in the surface acoustic wave propagation direction of the first surface acoustic wave resonator, wherein the positions in which the first and second surface acoustic wave resonators are formed on the piezoelectric substrate are in an at least partially overlapping relationship in a surface acoustic wave propagation region that is defined by virtually extending the respective openings of the first and second surface acoustic wave resonators; and the surface acoustic wave device further comprises a phase control portion for dividing the overlap surface acoustic wave propagation region into an upper half and a lower half and for affording the phases of surface acoustic waves that are propagated by the first surface acoustic wave resonator a mutually antiphase relationship in the upper-half region and lower-half region thus divided.

A second aspect of the surface acoustic wave device according to the present invention, which achieves the above object, comprises a piezoelectric substrate; a first surface acoustic wave resonator formed on the piezoelectric substrate; and a second surface acoustic wave resonator formed on the piezoelectric substrate in the surface acoustic wave propagation direction of the first surface acoustic wave resonator, wherein the positions in which the first and second surface acoustic wave resonators are formed on the piezoelectric substrate are in an at least partially overlapping relationship in a surface acoustic wave propagation region that is defined by virtually extending the respective openings of the first and second surface acoustic wave resonators; and the surface acoustic wave device further comprises a phase control portion for dividing the overlap surface acoustic wave propagation region into a plurality of regions and affording the phases of surface acoustic waves that are propagated by the first surface acoustic wave resonator a mutually antiphase relationship in the upper-half region and lower-half region of the respective regions thus divided.

According to a third aspect of the surface acoustic wave device according to the present invention, which achieves the above object, the phase control portion for affording the phases of the surface acoustic waves propagated by the first surface acoustic wave resonator a mutually antiphase relationship according to the first or second aspect are a metallic film that is formed on the piezoelectric substrate between the first and second surface acoustic wave resonators and that comprises a cutout of length L subject to the following relation in correspondence with the upper-half region or lower-half region of the overlap surface acoustic wave propagation region:

$$L=Vm*Vf*(2n+1)/(2*(Vf-Vm)*f)(n=1,2\ldots)$$

(where Vm is the velocity on the metallic film, Vf is the velocity in the region without the metallic film, and f is the drive frequency).

According to a fourth aspect of the surface acoustic wave device according to the present invention, which achieves the above object, the phase control portion for affording the phases of the surface acoustic waves propagated by the first surface acoustic wave resonator a mutually antiphase relationship according to the first or second aspect are a metallic film that is formed on the piezoelectric substrate between the first and second surface acoustic wave resonators and that is of length L subject to the following relation in correspondence with the upper-half region or lower-half region of the overlap surface acoustic wave propagation region:

$$L=Vm*Vf*(2n+1)/(2*(Vf-Vm)*f)(n=1,2 \ldots )$$

(where Vm is the velocity on the metallic film, Vf is the velocity in the region without the metallic film, and f is the drive frequency of the first surface acoustic wave resonator).

Further, a fifth aspect of the surface acoustic wave device according to the present invention, which achieves the above object, comprises a piezoelectric substrate; a first surface acoustic wave resonator formed on the piezoelectric substrate; and a second surface acoustic wave resonator formed on the piezoelectric substrate in the surface acoustic wave propagation direction of the first surface acoustic wave resonator, wherein N electrodes subject to the following relation among a plurality of electrodes that constitute a reflector that is disposed on a side of the first surface acoustic wave resonator opposite the second surface acoustic wave resonator are half the size of the opening width of the reflector part, and the phases of surface acoustic waves that are propagated by the first surface acoustic wave resonator are subject to a mutually antiphase relationship in the upper-half region and lower-half region with the above ½ width:

$$4*N/\lambda=Vm*Vf*(2n+1)/(2*(Vf-Vm)*f)(n=1,2, \ldots )$$

(where λ is the wavelength of the propagated surface acoustic wave and the length of the reflector is λ/4).

In addition, a sixth aspect of the surface acoustic wave device according to the present invention, which achieves the above object, is a surface acoustic wave device in which at least two or more vertically connected surface acoustic wave resonators are arranged in at least two or more sets on a piezoelectric substrate, wherein the positions in which adjacent first and second surface acoustic wave resonators of different sets are formed on the piezoelectric substrate are in an at least partially overlapping relationship in a surface acoustic wave propagation region that is defined by virtually extending the respective openings of the first and second surface acoustic wave resonators; a wraparound electrode is formed between the adjacent first and second surface acoustic wave resonators; and the wraparound electrode comprises a cutout of length L subject to the following relation in correspondence with the upper-half region or lower-half region of the overlap surface acoustic wave propagation region:

$$L=Vm*Vf*(2n+1)/(2*(Vf-Vm)*f)(n=1,2 \ldots )$$

(where Vm is the velocity on the metallic film, Vf is the velocity in the region without the metallic film, and f is the drive frequency).

The characteristics of the present invention will become more evident from the embodiments of the invention described hereinbelow with reference to the drawings.

BRIEF DESCRIPTION OF THE DRAWINGS

FIG. 3 illustrates a method for forming a groove in order to prevent the propagation of the surface acoustic wave to an adjacent filter;

FIG. 4 illustrates a method for coating with a highly viscous epoxy resin to absorb surface acoustic waves between transmission and reception filters in order to prevent the propagation of the surface acoustic wave to an adjacent filter;

As a result of the constitution of the present invention, signal interference between resonators in a common package can be eliminated without forming a groove by means of dicing, whereby it is possible to obtain a surface acoustic wave device that allows a plurality of surface acoustic wave filters to be formed on one chip and permits greater miniaturization.

DESCRIPTION OF THE PREFERRED EMBODIMENTS

Embodiments of the present invention will be described hereinbelow with reference to the drawings. The embodiments permit an understanding of the present invention but the technological scope of the present invention is not limited to or by these embodiments.

Here, prior to the description of the embodiments, the problems to be solved by the present invention will be described in more detail to permit an understanding of the present invention.

Figure 1:
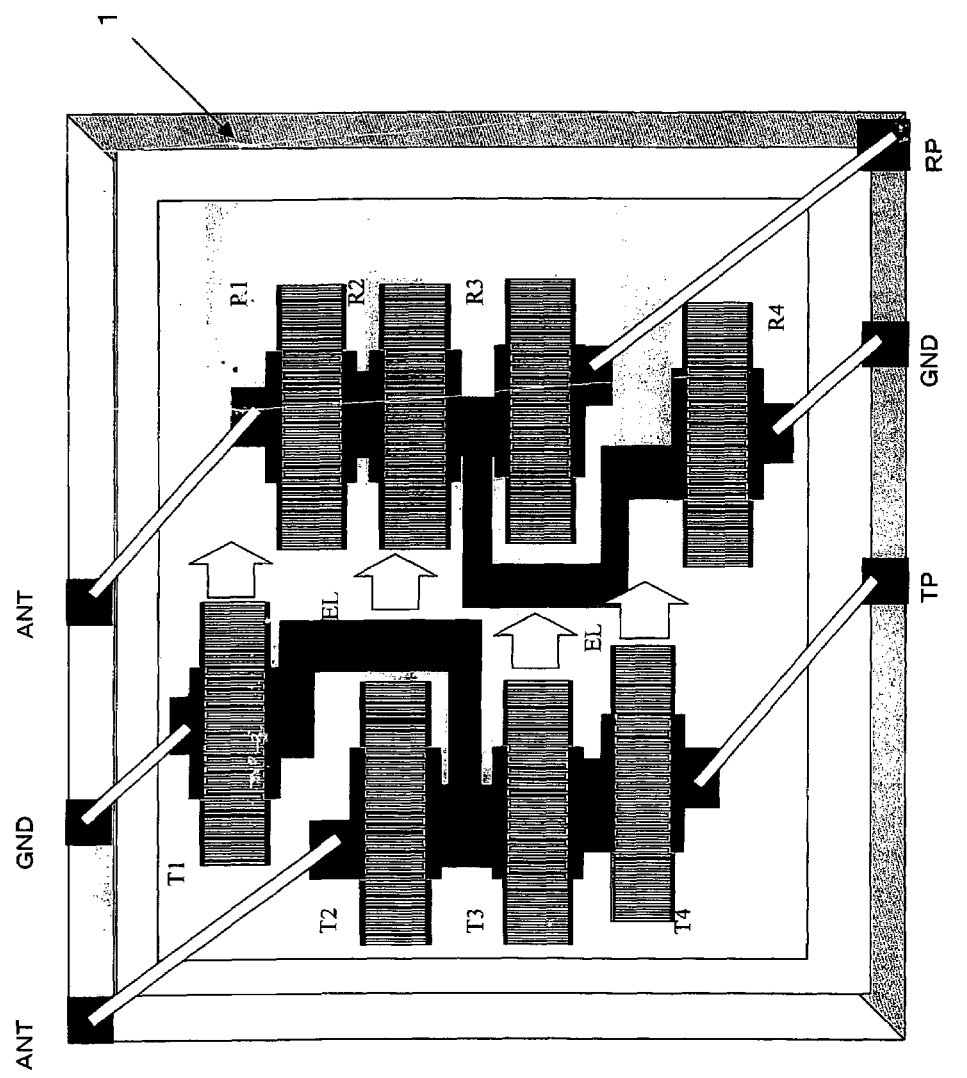
FIG. 1 shows a conventional constitutional example of a surface acoustic wave device that functions as an antenna duplexer that is constituted by two ladder-type surface acoustic wave filters.

FIG. 1 shows a conventional constitution example of a surface acoustic wave device that functions as an antenna duplexer constituted by two ladder-type surface acoustic wave filters. A transmission signal is applied to a transmission terminal that is denoted by TP in FIG. 1 and reaches an antenna pad ANT via a transmission filter in which surface acoustic wave (SAW) resonators T1 to T4 are connected in the form of a ladder.

In addition, a reception filter, in which SAW resonators R1 to R4 are connected in the form of a ladder, is connected to an antenna (not shown) via a phase shifter (not shown).

The transmission signal reaches the antenna via the transmission filter and is emitted as a radio wave as mentioned earlier, being applied to the reception filter at one end. However, in the transmission frequency band, the band of the reception filter is in the attenuation band, and therefore the transmission signal barely reaches the reception terminal RP that is connected to a receiver low noise amplifier.

A signal in the reception frequency band is also in the attenuation band in the transmission filter and in the passband in the reception filter. Therefore, a signal received by the antenna arrives at the reception terminal RP via the phase shifter and antenna terminal ANT but barely reaches the transmission terminal TP.

Here, the isolation characteristic indicates the transmission characteristic according to which a signal inputted from the transmission side is outputted to the reception terminal RP via the transmission SAW resonators T4, T3, then T2, the antenna pad ANT, and then the reception resonators R1, R2, then R3. This transmission characteristic desirably undergoes an attenuation of −50 dB or less.

However, when the transmission and reception filters exist on the same chip, cases arise where a signal inputted from the transmission side is outputted to the reception terminal RP via a short circuit that includes the transmission resonator T3, surface acoustic wave propagation, and then the reception resonator R3, or the transmission resonator T2, surface acoustic wave propagation, and the reception resonator R2. As a result of such a short circuit, the isolation characteristic deteriorates and spurious emission occurs.

Figure 2A:
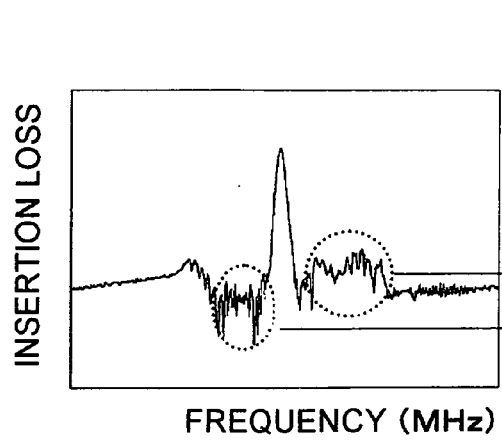
FIGS. 2A and 2B illustrate spurious emission in the filter characteristic.
Figure 2B:
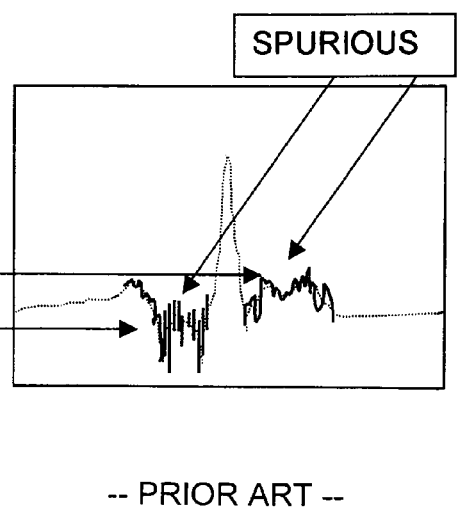

FIG. 2 illustrates spurious emission in the filter characteristic. FIG. 2A shows the attenuation characteristic rendered by an insertion loss with respect to the frequency, spurious emission being generated by the formation of the short circuit of the surface acoustic wave in the conventional constitution above in the part circled by a broken line in FIG. 1. FIG. 2B indicates the extraction of this spurious emission component. The filter characteristics deteriorate as a result of the production of this spurious emission.

In order to avoid the occurrence of spurious emission caused by the formation of such an acoustic-surface-wave short circuit, conventional countermeasures include one method that forms a groove by means of dicing as shown in FIG. 3 in order to prevent the propagation of a surface acoustic wave to an adjacent filter as mentioned earlier.

In FIG. 3, a groove 2 is formed in the center of the chip by means of dicing for division in two regions, which are a transmission-side region I and a reception-side region II. The formation of a path along which a surface acoustic wave is short-circuited from a resonator in the transmission-side region I to a resonator in the reception-side region II can thus be prevented as a result of the groove 2.

Here, since the minimum width of a groove that is formed by means of dicing and that allows the formation of a short circuit to be prevented is on the order of approximately 50 μm, it is not a large impediment to the miniaturization of the chip. However, because the dicing is performed at the center of the chip, this limits the layout of the chip. In addition, there is the problem of the high probability of an effect on the transmission/reception filters caused by chipping of dicing.

As another method of preventing the formation of a short circuit, a method that involves applying a highly viscous epoxy resin to absorb surface acoustic waves between the transmission and reception filters may be assumed. FIG. 4 illustrates such a method. An epoxy resin 3 is applied instead of forming a groove 2 between the transmission and reception filters. However, there is the probability of deterioration in the characteristics due to the chemical influence of the epoxy resin. Further, a broad application area is required in order to absorb surface acoustic waves, which makes chip miniaturization problematic.

Figure 5:
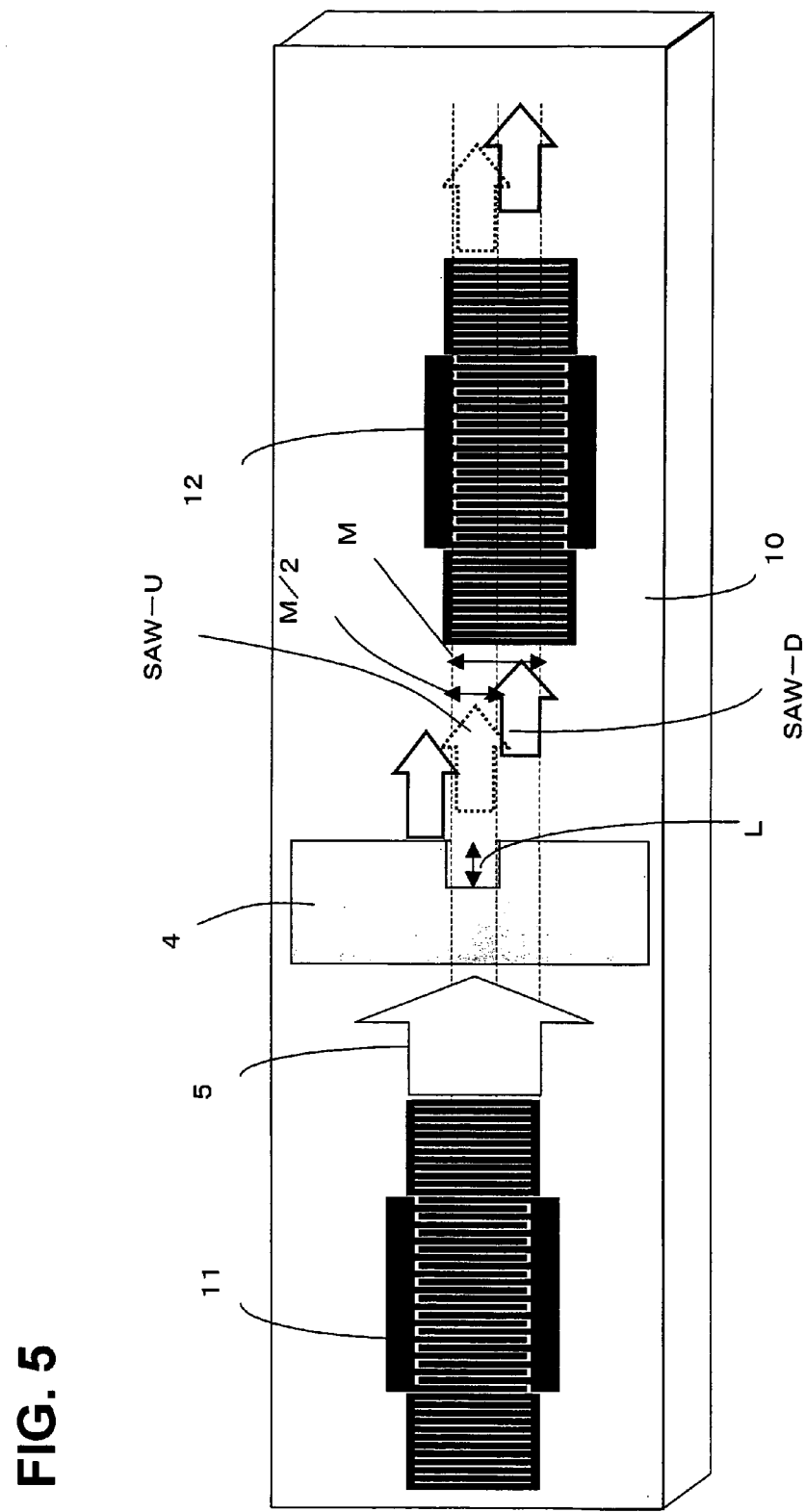
FIG. 5 is a first embodiment of a surface acoustic wave device to which the present invention is applied.

Therefore, the present invention resolves the problems of conventional methods of preventing the formation of short-circuiting of a surface acoustic wave. FIG. 5 is a first embodiment of a surface acoustic wave device to which the present invention is applied.

A pair of SAW resonators 11 and 12 is formed opposite one another by means of a metallic film such as aluminum or an aluminum alloy on the surface of a piezoelectric substrate 10 of LiTaO$_3$, LiNbO$_3$, or the like. In addition, a metallic film 4 is formed between the SAW resonators 11 and 12.

The SAW resonators 11 and 12 each have a different frequency characteristic in the surface acoustic wave device that corresponds with the intended usage of the surface acoustic wave device. In addition, the positions in which the SAW resonators 11 and 12 are formed on the piezoelectric substrate 10 are in an at least partially overlapping relationship in a surface acoustic wave propagation region that is defined by virtually extending the respective openings of the SAW resonators 11 and 12. These requirements are also the same in the embodiments described hereinbelow.

As a result of this partially overlapping relationship, the width within which the surface acoustic wave 5 propagated from the SAW resonator 11 is received by the SAW resonator 12, that is, the width of overlap with the electrode of the SAW resonator 12, is guided, this width being 'M'.

The metallic film 4 provided between the SAW resonators 11 and 12 is provided with a cutout of length L in a part corresponding to the width M/2, which is the upper half of the width of the overlap of the electrode with the SAW resonator 12. As a result of this electrode cutout of width M/2 and length L, a phase difference is produced for the surface acoustic wave 5 that is inputted to the SAW resonator 12, between the upper half portion SAW-U and lower-half SAW-D of width M of the surface acoustic wave 5.

That is, supposing that the velocity in the lower region of the metallic film 4 is Vm, the velocity in the region without the metallic film 4 is Vf, where f is the drive frequency, in the event of a cutout length L that fulfils the condition, $$L/Vm - L/Vf = (2n+1)/(2*f) \qquad \text{Equation 1}$$
$$\rightarrow L = Vm*Vf*(2n+1)/(2*(Vf-Vm)*f)$$
$$(n = 1, 2 \dots )$$

the upper-half surface acoustic wave SAW-U and lower-half surface acoustic wave SAW-D, which arrive at the SAW resonator 12 of the propagated surface acoustic wave 5, possess a phase difference that is an odd multiple of the half wavelength of the surface acoustic wave.

The surface acoustic wave SAW-U and surface acoustic wave SAW-Dare antiphase to each other. Therefore, because the phases of the upper-half surface acoustic wave SAW-U and lower-half surface acoustic wave SAW-D of the surface acoustic wave 5 that reaches the SAW resonator 12 facing the SAW resonator 11 are antiphase to each other, the two waves SAW-U and SAW-D offset each other, meaning that a spurious signal is no longer received by the SAW resonator 12. As a result, the spurious signal can be reduced.

Figure 6:
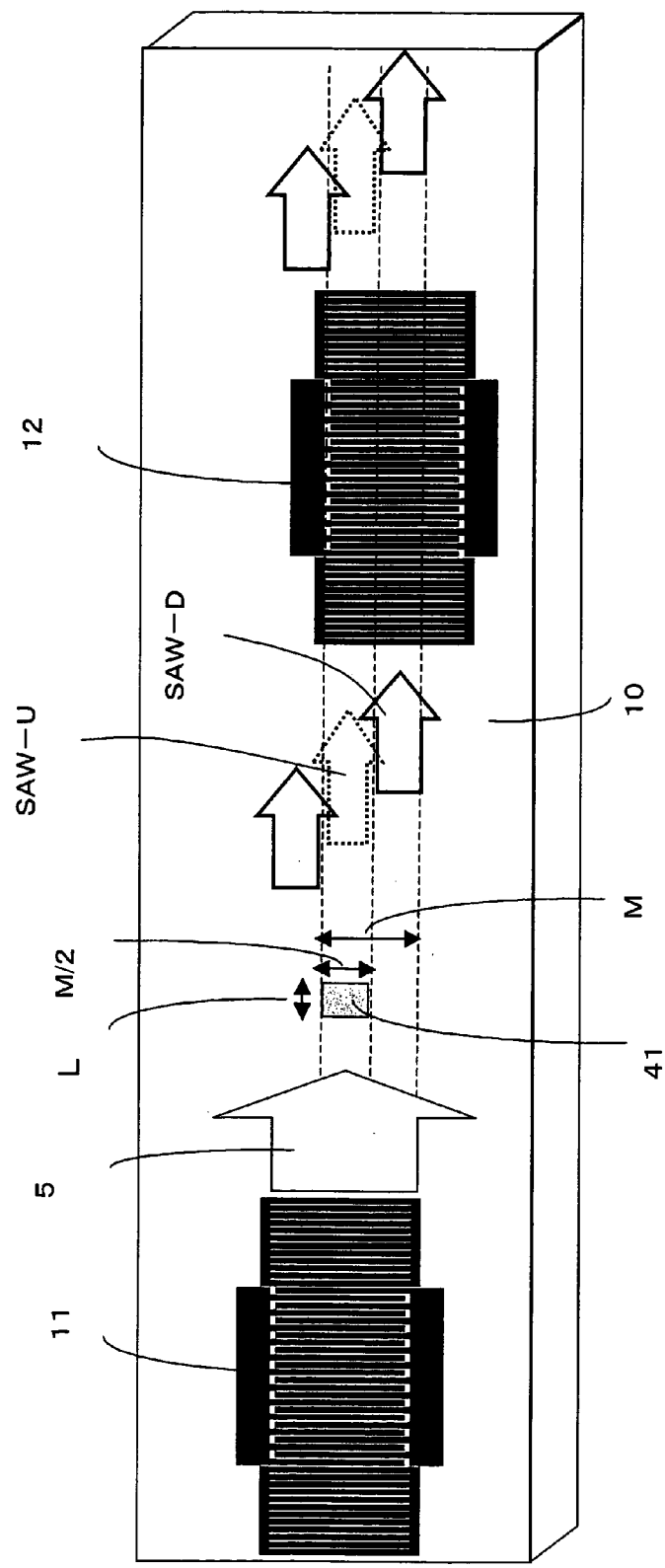
FIG. 6 is a second embodiment of the present invention.

FIG. 6 is a second embodiment of the present invention. In FIG. 6, the same reference numerals have been assigned to the same elements as those of the first embodiment in FIG. 5. As per FIG. 5, the SAW resonators 11 and 12 are placed on the piezoelectric substrate 10.

The embodiment shown in FIG. 6 is a constitution in which a part that corresponds to a cutout equivalent to the width M/2 and length L of the metallic film 4 of the embodiment in FIG. 5 is reversely made the metallic film 41. Electrode is not formed between the SAW resonators 11 and 12 in other parts.

Even where the embodiment is as shown in FIG. 6, due to the existence of the metallic film 41, a phase difference is produced between the upper-half surface acoustic wave SAW-U and the lower-half surface acoustic wave SAW-D of the surface acoustic wave 5 propagated by the SAW resonator 11 that arrives at the SAW resonator 12. Accordingly, similarly also with this embodiment, because the phases of the upper-half surface acoustic wave SAW-U and the lower-half surface acoustic wave SAW-D are antiphase to each other, the two waves offset each other, meaning that a spurious signal is no longer received by the SAW resonator 12. As a result, the spurious signal can be reduced as per the embodiment in FIG. 5.

The foregoing embodiments are examples in which a surface acoustic wave propagation region, which is defined by virtually extending the respective openings of the first SAW resonator 11 and second SAW resonator 12, is divided into an upper-half region and a lower-half region. The present invention further divides the overlap surface acoustic wave propagation regions into a plurality of regions and is also able to afford the phases of surface acoustic waves propagated by the SAW resonator 11 an antiphase relationship in the upper-half regions and lower-half regions of these divided regions.

Figure 7:
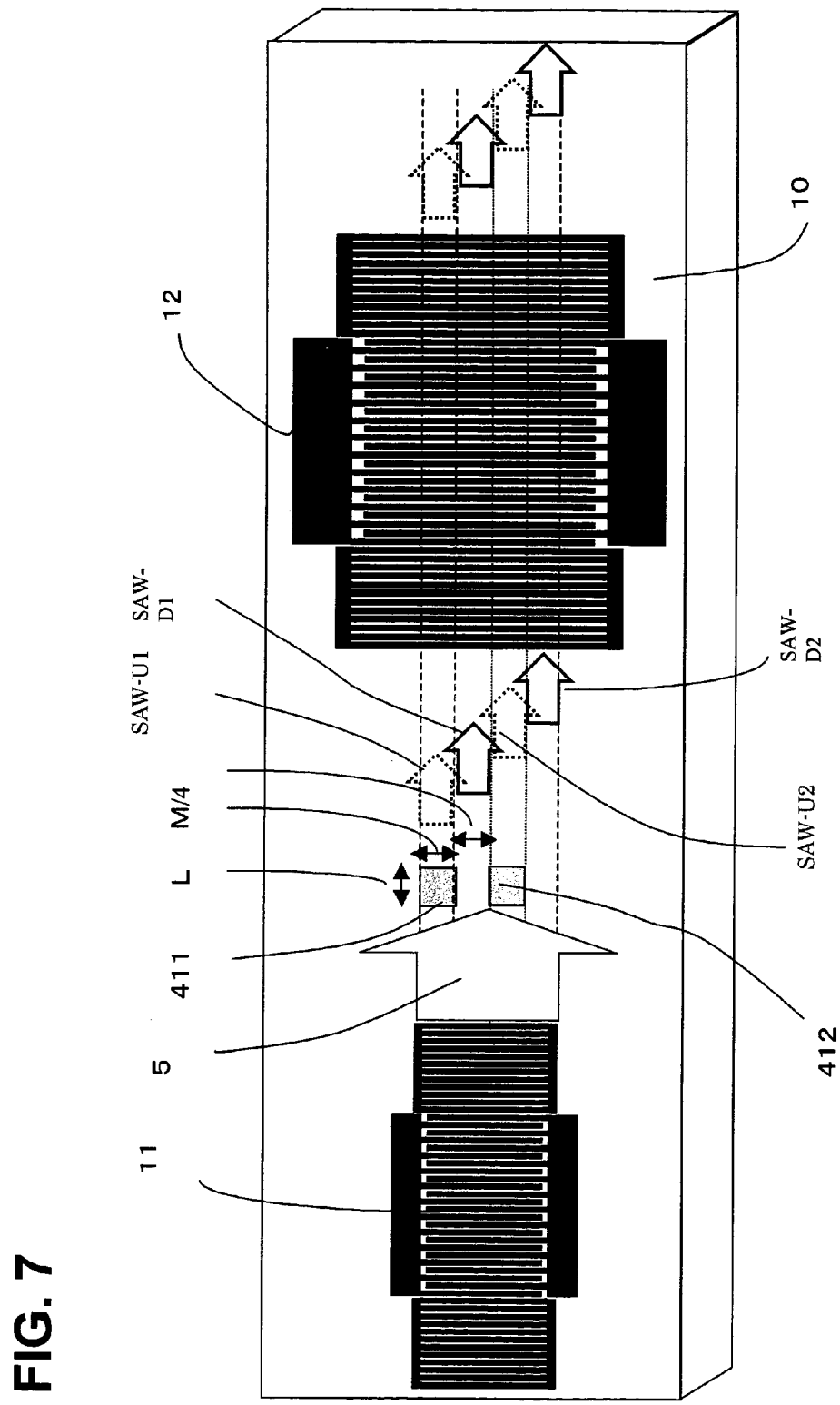
FIG. 7 is a third embodiment of the present invention.

FIG. 7 is a third embodiment of the present invention in which an overlap surface acoustic wave propagation region is divided into two regions and the phases of surface acoustic waves are afforded an antiphase relationship to each other in the upper-half region and lower-half region of each of these divided regions.

In FIG. 7, the same reference numerals have been assigned to the same constituent elements as those of the above embodiment. As per the embodiment in FIG. 6, the resonators 11 and 12 are placed on a piezoelectric substrate 10. In addition, a metallic film 41 of width M/2 and length L, which is disposed between the SAW resonators 11 and 12 of the embodiment in FIG. 6, is further divided into metallic films 411 and 412 of width M/4.

As a result of this constitution, two metallic films 411 and 412 of width M/4 and length L exist between the SAW resonators 11 and 12, and the surface acoustic wave 5 propagated by the SAW resonator 11 is separated into surface acoustic waves SAW-UL and U2, which are propagated over the metallic films 411 and 412, and surface acoustic waves SAW-DL and D2, which are propagated via parts without electrode.

Therefore, the surface acoustic waves SAW-U1 and U2, which are propagated over the metallic films 411 and 412, and surface acoustic waves SAW-D1 and D2, which are propagated via parts without electrode, are antiphase to each other and, when propagated to the SAW resonator 12, the surface acoustic waves SAW-U1 and D1 and SAW-U2 and D2 counteract one another such that the SAW resonator 12 does not receive a spurious signal. As a result, the spurious signal can be reduced.

Figure 8:
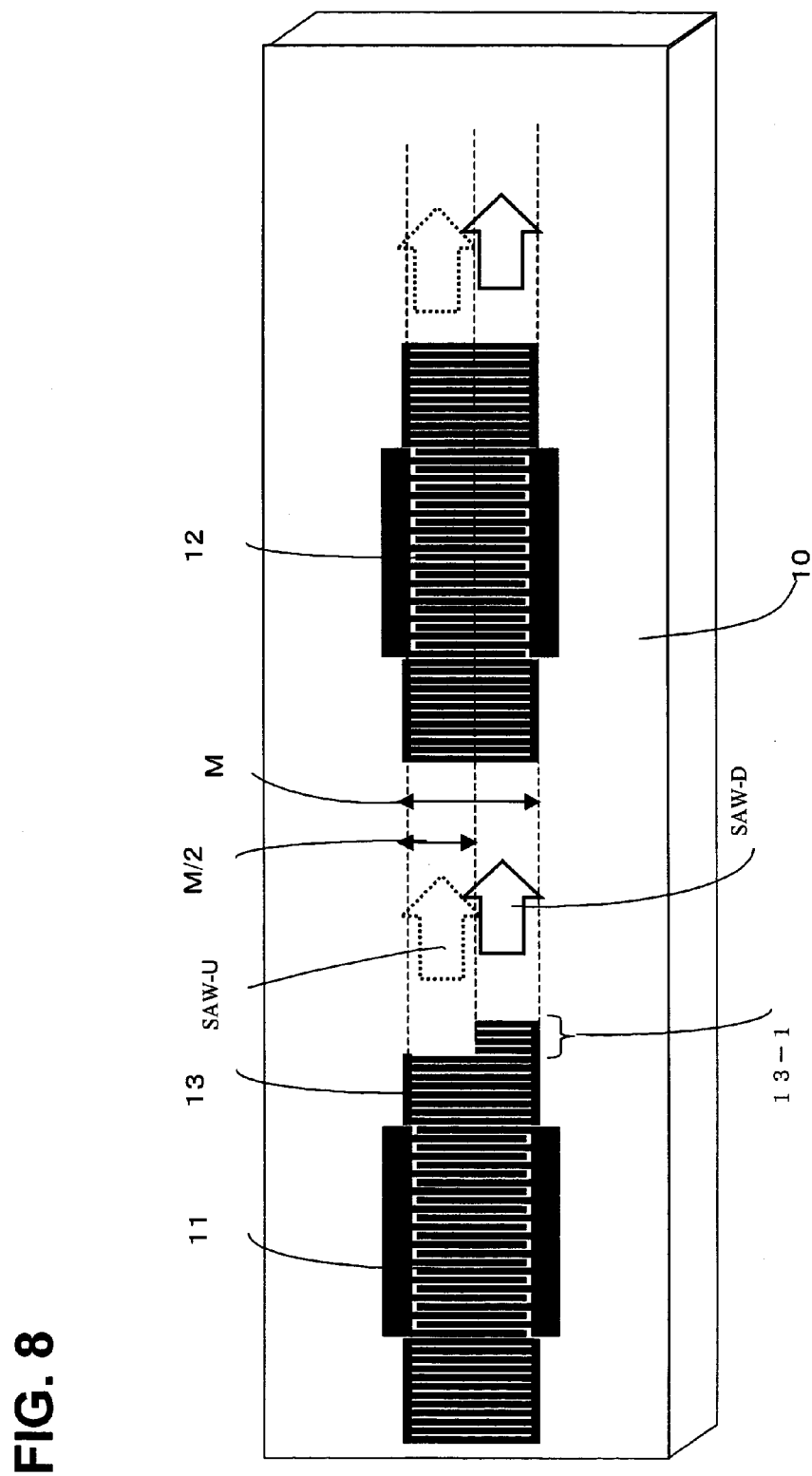
FIG. 8 is another embodiment according to the present invention.

FIG. 8 is yet another embodiment of the present invention. In FIG. 8, the same reference numerals have been assigned to the same constituent elements as those of the embodiment above. As per each of the above embodiments, the SAW resonators 11 and 12 are disposed facing one another on the piezoelectric substrate 10. A characteristic of this embodiment is that the opening width of part of the reflector 13 of the SAW resonator 11 facing the SAW resonator 12 is made half. That is, N reflector part electrodes 13-1 among a plurality of electrodes that constitute the reflector 13 have half the width of the others.

The length of the width of the reflector part 13-1, which is half the electrode length of the reflector 13, is made equal to the length L of each of the above embodiments (the length L of the cutout of the electrode disposed between the resonators 11 and 12 of embodiment 1, and the length L of the electrode disposed between the resonators 11 and 12 in embodiments 2 and 3).

That is, for the reflector 13 with the length λ/4, by halving the opening width of the reflector part 13-1, the length of N of which satisfies:

$$4*N/\lambda = Vm*Vf*(2n+1)/(2*(Vf-Vm)*f)(n=1,2,\ldots),$$

the same action and effects are obtained as those of the above embodiment, where Vm is the velocity of a part with the reflector electrodes and Vf is the velocity of a part without reflector electrodes.

For a surface acoustic wave emitted by the reflector 13, an acoustic velocity differential and a phase difference are produced between part SAW-D, in which the N reflector partial electrodes 13-1 are not present, and part SAW-U, which has these partial electrodes.

Therefore, surface acoustic wave SAW-U and surface acoustic wave SAW-D counteract each other and the SAW resonator 12 does not receive a spurious signal. As a result, the spurious signal can be reduced.

Figure 9:
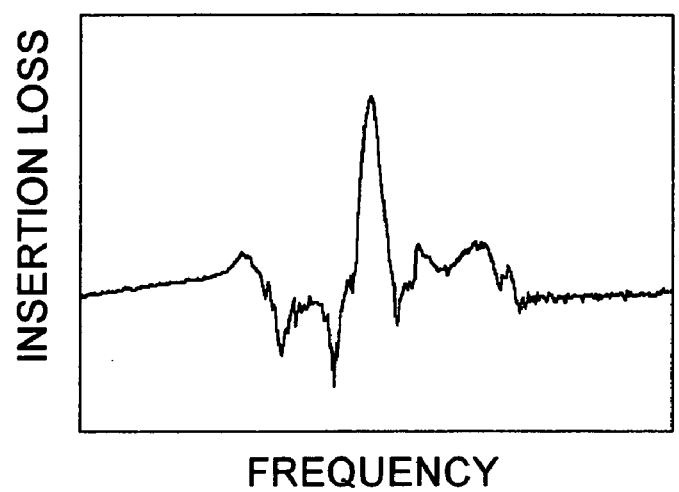
FIG. 9 is a graph showing the effect of each of the embodiments.

FIG. 9 is a graph showing the effect of each of the above embodiments, the frequency (MHz) being plotted on the horizontal axis and the insertion loss (dB) being plotted on the vertical axis. As is evident from a comparison with FIG. 2, it can be seen that spurious emission is reduced by the present invention.

Figure 10:
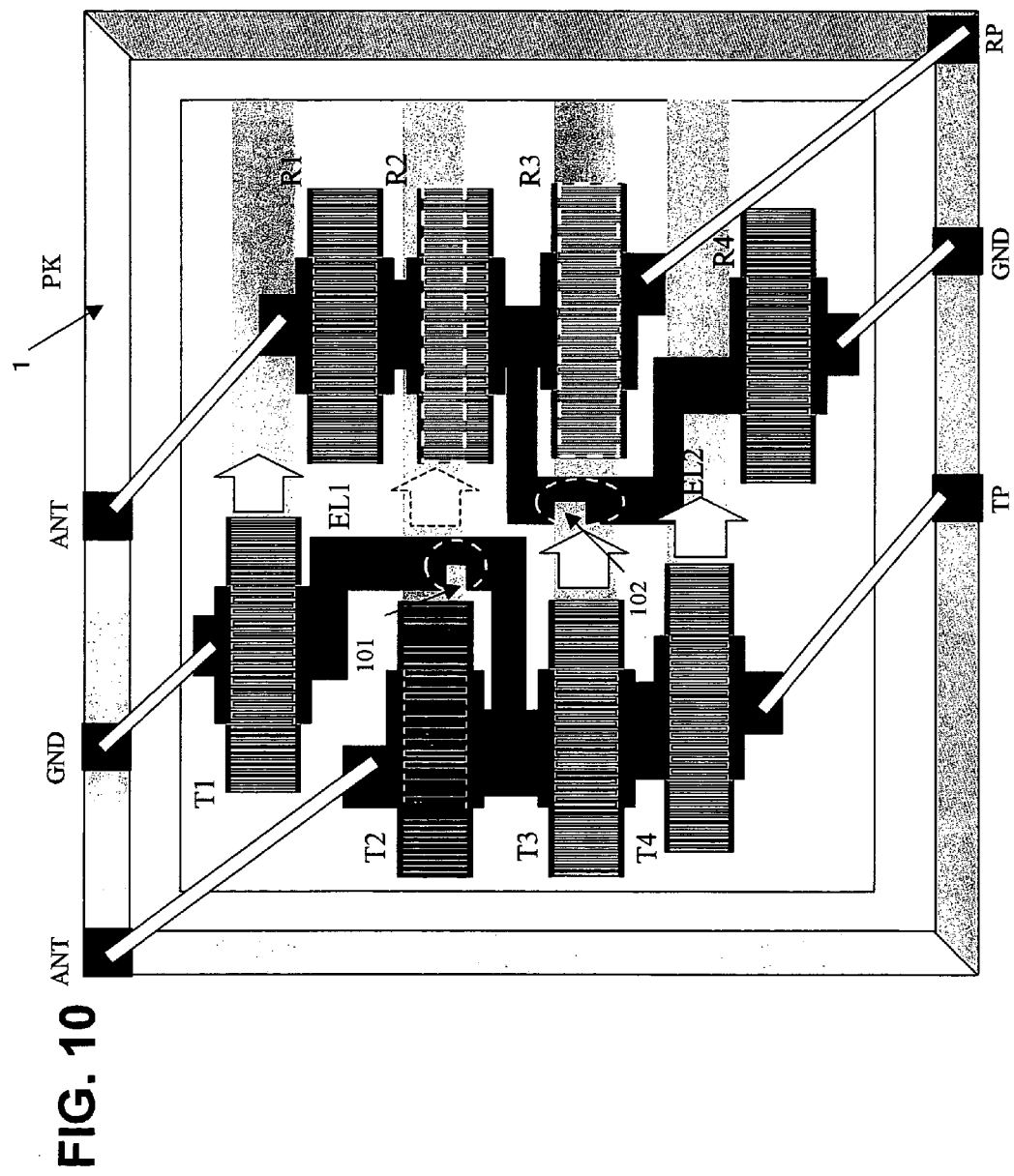
FIG. 10 is an embodiment in which the present invention is also applied to a surface acoustic wave device that functions as an antenna duplexer constituted by two ladder-type surface acoustic wave filters.

FIG. 10 is an embodiment in which the present invention is also applied to a surface acoustic wave device that functions as an antenna duplexer constituted by two ladder-type surface acoustic wave filters.

A transmission signal is applied to the transmission terminal TP in FIG. 10 and reaches the antenna pad ANT via a transmission filter in which surface acoustic wave (SAW) resonators T1 to T4 are connected in the form of a ladder.

In addition, a reception filter, in which SAW resonators R1 to R4 are connected in the form of a ladder, is connected to an antenna (not shown) via a phase shifter (not shown).

Here, in the constitution shown in FIG. 10, a surface acoustic wave propagation path generated by SAW resonators T2 and T3 of the transmission filter and the positions of the SAW resonators R2 and R3 of the reception filter overlap one another. There is therefore the possibility of a short circuit being formed between the surface acoustic wave propagation path and SAW resonators R2 and R3 for the surface acoustic wave between the transmission and reception filters.

In the embodiment shown in FIG. 10, in order to avoid this short-circuit formation, cutouts 101 and 102 of length L and width M/2 are formed in wraparound electrodes EL1 and EL2 that are formed between the transmission filter and reception filter as per the constitution in FIG. 5. As a result, according to the same principle described in FIG. 5, it is possible to avoid short-circuit coupling of a surface acoustic wave generated by the SAW resonators T2 and T3 of the transmission filter with the SAW resonators R2 and R3 of the reception filter. It can be seen that spurious emission can also be reduced in this manner in the embodiment of FIG. 10.

Figure 11:
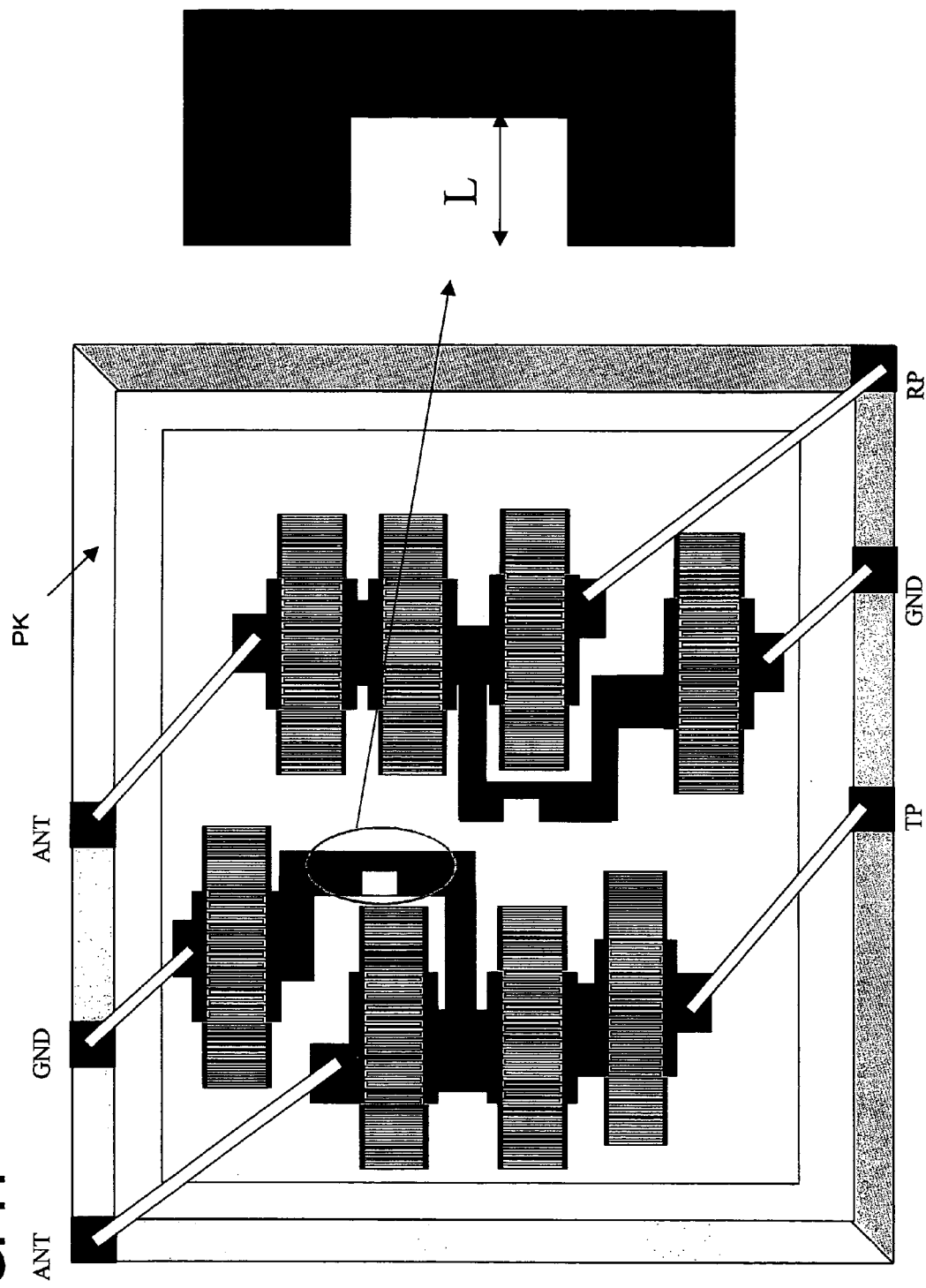
FIG. 11 is for consideration of the relationship between a cutout of length L and the electrode width of wraparound electrodes EL1 and EL2 in the embodiment in FIG. 10.

FIG. 11 is for consideration of the relationship between a cutout of length L that is formed in the wraparound electrodes EL1 and EL2 and the electrode width of the wraparound electrodes EL1 and EL2 in the embodiment in FIG. 10.

When a cutout, the length L of which is smaller than the electrode width of the wraparound electrode EL1 (same is true for EL2) that is shown partially enlarged on the right-hand side of FIG. 11, is formed, supposing that, in Equation 1, Vm=4113.3 (m/s), Vf=4210.3 (m/s), and f=800 MHz, this gives:

$$L = 4113.3*4210.3*0.5/(800*97*106) \text{ (m)}$$
$$= 111*10-6 \text{ (m)}$$
$$= 111 \text{ (μm)}.$$

Therefore, a cutout of length L can be formed in the wraparound electrode without changing the electrode width that is used in the chip of the duplexer of the communication apparatus that is used in mobile-communication frequency bands that are employed currently.

According to the present invention, the unnecessary coupling of a surface acoustic wave between a plurality of SAW resonators mounted in a common package can be avoided without the need to form a groove between the SAW resonators or to provide an acoustic-surface-wave absorbent. As a result, a surface acoustic wave device that eliminates unnecessary spurious emission in the filter characteristic and that permits miniaturization of the device can be provided, and hence the contribution to the industry is substantial.

Moreover, although a one port-type SAW resonator was described in the above embodiment, the application of the present invention is not limited to such a case. That is, a plurality of IDT (comb-shaped electrode converters) is placed in the direction of propagation of the surface acoustic wave according to the application of the present invention, and it can be easily seen that analogous action is obtained with a 2-port-type SAW resonator and DMS (multimode filter) on the two sides of which a grating reflector is provided.

What is claimed is:

1. A surface acoustic wave device, comprising:
a piezoelectric substrate;
a first surface acoustic wave resonator formed on the piezoelectric substrate;
a second surface acoustic wave resonator formed on the piezoelectric substrate in the surface acoustic wave propagation direction of the first surface acoustic wave resonator,
wherein the positions in which the first and second surface acoustic wave resonators are formed on the piezoelectric substrate are in an at least partially overlapping relationship in a surface acoustic wave propagation region that is defined by virtually extending the respective openings of the first and second surface acoustic wave resonators; and
a phase control portion for dividing the overlap surface acoustic wave propagation region into an upper half and a lower half and for affording the phases of surface acoustic waves that are propagated by the first surface acoustic wave resonator a mutually antiphase relationship in the upper-half region and lower-half region thus divided.

2. A surface acoustic wave device, comprising:
a piezoelectric substrate;
a first surface acoustic wave resonator formed on the piezoelectric substrate;
a second surface acoustic wave resonator formed on the piezoelectric substrate in the surface acoustic wave propagation direction of the first surface acoustic wave resonator,
wherein the positions in which the first and second surface acoustic wave resonators are formed on the piezoelectric substrate are in an at least partially overlapping relationship in a surface acoustic wave propagation region that is defined by virtually extending the respective openings of the first and second surface acoustic wave resonators; and
a phase control portion for dividing the overlap surface acoustic wave propagation region into a plurality of regions and affording the phases of surface acoustic waves that are propagated by the first surface acoustic wave resonator a mutually antiphase relationship in the upper-half region and lower-half region of the respective regions thus divided.

3. The surface acoustic wave device according to claim 1 or 2, wherein the phase control portion for affording the phases of the surface acoustic waves propagated by the first surface acoustic wave resonator a mutually antiphase relationship are a metallic film that is formed on the piezoelectric substrate between the first and second surface acoustic wave resonators and that comprises a cutout of length L subject to the following relation in correspondence with the upper-half region or lower-half region of the overlap surface acoustic wave propagation region:

$$L=Vm*Vf*(2n+1)/(2*Vf-Vm)*f)(n=1,2\ldots)$$

(where Vm is the velocity on the metallic film, Vf is the velocity in the region without the metallic film, and f is the drive frequency).

4. The surface acoustic wave device according to claim 1 or 2, wherein the phase control portion for affording the phases of the surface acoustic waves propagated by the first surface acoustic wave resonator a mutually antiphase relationship are a metallic film that is formed on the piezoelectric substrate between the first and second surface acoustic wave resonators and that is of length L subject to the following relation in correspondence with the upper-half region or lower-half region of the overlap surface acoustic wave propagation region:

$$L=Vm*Vf*(2n+1)/(2*Vf-Vm)*f)(n=1,2\ldots)$$

(where Vm is the velocity on the metallic film, Vf is the velocity in the region without the metallic film, and f is the drive frequency of the first surface acoustic wave resonator).

* * * * *